United States Patent [19]

Kanayama et al.

[11] Patent Number: 5,462,626
[45] Date of Patent: Oct. 31, 1995

[54] METHOD OF BONDING AN EXTERNAL LEAD AND A TOOL THEREFOR

[75] Inventors: Shinji Kanayama, Kashihara; Akira Kabeshita, Hirakata; Kenichi Nishino, Osaka; Satoshi Ohnakada, Toyonaka; Takahiko Murata, Kadoma; Kazuhiro Kimura, Maebashi; Kazuto Nishida, Katano, all of Japan

[73] Assignee: Matsushita Electric Industrial Co., Ltd., Osaka, Japan

[21] Appl. No.: 98,813

[22] Filed: Jul. 29, 1993

[30] Foreign Application Priority Data

Jul. 30, 1992 [JP] Japan ................................. 4-203337
Jul. 31, 1992 [JP] Japan ................................. 4-204854

[51] Int. Cl.$^6$ ................................. B32B 31/00
[52] U.S. Cl. ................................. 156/272.8; 156/380.9; 156/497; 156/498; 156/311; 219/121.64; 219/121.84; 228/118; 228/46; 228/180.1; 228/200
[58] Field of Search ................................. 219/129, 85 BA, 219/85 BM, 85 D, 121.64, 121.84; 156/497, 498, 289, 311, 272.8, 380.9; 228/118, 46, 180.1, 200

[56] References Cited

U.S. PATENT DOCUMENTS

| | | | |
|---|---|---|---|
| 3,605,244 | 9/1971 | Osborne et al. | 228/180.1 |
| 4,489,487 | 12/1984 | Bura | 206/330 |
| 4,684,055 | 8/1987 | Baer et al. | 228/180.1 |
| 4,970,365 | 11/1990 | Chalco | 219/121.64 |
| 5,019,201 | 5/1991 | Yabu et al. | 156/273.9 |
| 5,194,710 | 3/1993 | McDaniel et al. | 219/121.64 |
| 5,227,604 | 7/1993 | Freedman | 219/121.64 |
| 5,234,105 | 8/1993 | Sato et al. | 206/330 |
| 5,276,298 | 1/1994 | Jones et al. | 219/121.64 |
| 5,289,966 | 3/1994 | Izumi et al. | 219/121.64 |

Primary Examiner—Chester T. Barry
Attorney, Agent, or Firm—Wenderoth, Lind & Ponack

[57] ABSTRACT

A bonding method of for external leads which includes the steps of registering the external leads of an IC component with electrodes of a circuit substrate, setting an external lead retaining surface of a bonding tool on a flat outer tab obtained by coating plural outer end parts of the external leads of the registered IC component with resin, and bringing the external leads in touch with the corresponding electrodes. A laster beam irradiates one of the external leads registered on one of the electrodes to thereby bond them, and cooling gas is jetted on a bonding part of the external lead to cool a bonding part of the external lead and the electrode. During the irradiating step, the one of the external leads registered on one of the corresponding electrodes can be pressed against the electrode to bond the bonding part of the electrode and the external lead. A bonding tool which is used in the method includes a wall having an external lead retaining surface for being set on the flat outer tab and pressing one of the external leads, to bring the one of the external leads into touch with the corresponding one of the electrodes. A laser beam passage is provided in the bonding tool through which a laser beam is irradiated to an external lead bonding part, and a gas passage is also provided, through which cooling gas is jetted on to the external lead bonding part to cool the bonding part of the external lead and the electrode.

14 Claims, 9 Drawing Sheets

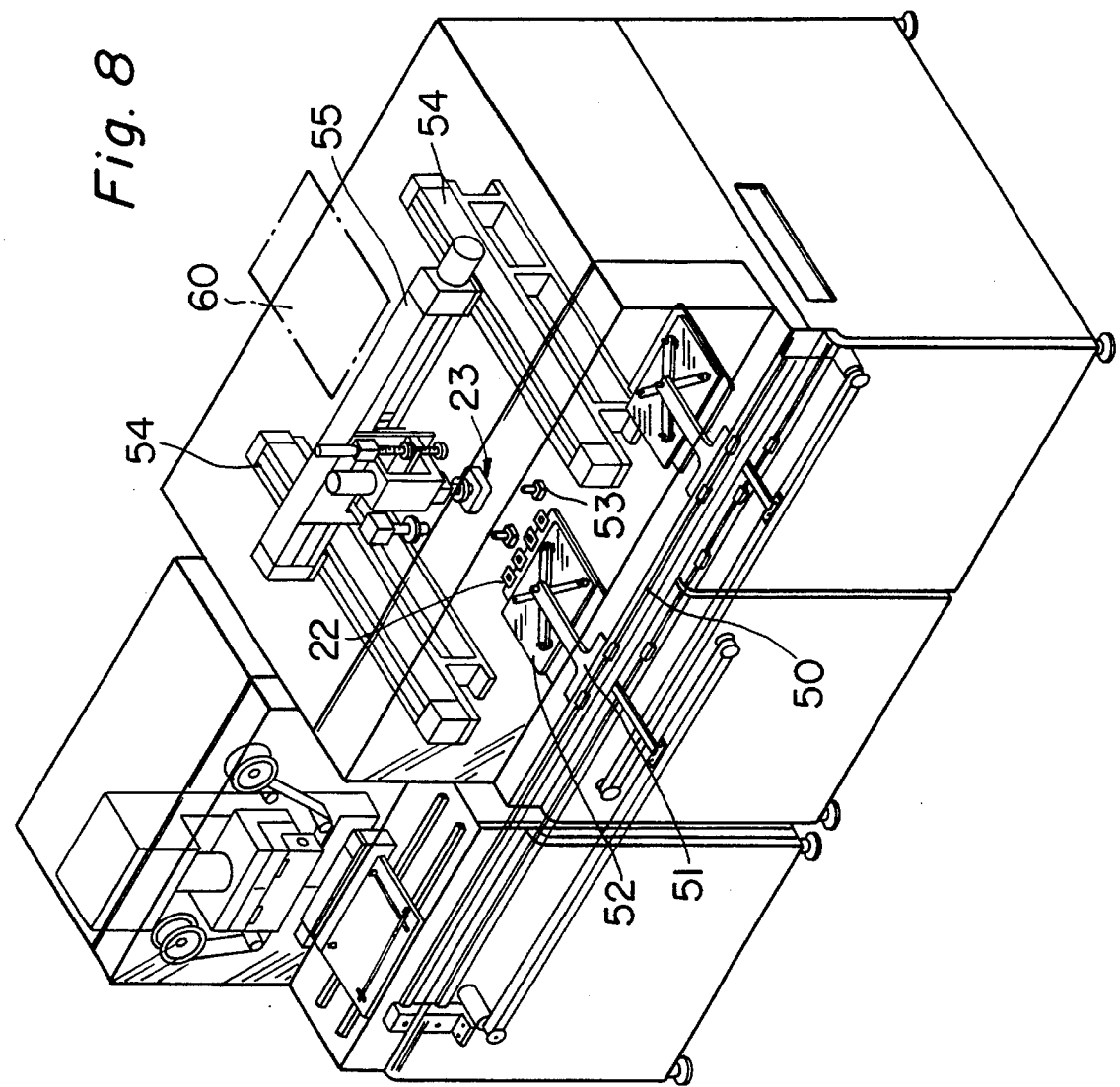

METHOD OF BONDING AN EXTERNAL LEAD AND A TOOL THEREFOR

BACKGROUND OF THE INVENTION

The present invention relates to a method and a tool for bonding external leads of an IC component mounted on a circuit substrate with electrodes of the circuit substrate.

Conventionally, in bonding lead wires of an IC component mounted on a circuit substrate with electrodes of the circuit substrate, a reflow method for melting a cream solder on each electrode has generally been employed. The reflow method is not convenient in some cases because the IC component or a liquid crystal panel to be bonded with the IC component is exposed to a high temperature when passing through a reflow apparatus, and the equipment becomes bulky in structure.

In the meantime, for bonding leads of an IC component which is low in thermal resistance, it has been proposed to provide bonding metallic layers on electrodes of a substrate by plating solders, placing leads of the IC component on the bonding metallic layers and then pressing the leads against the electrodes with a heating tool. That is, a bonding method for bonding the leads via the bonding metallic layers by heat and pressure has been practiced. In this case, such a heating tool has been built in to the substrate or a pulse current has been supplied to instantaneously heat the leads.

According to the above bonding method using the heating tool, when the leads are heated by the high-temperature heating tool, the flux of the bonding metal is adhered to the heating tool, therefore making uniform heating and pressuring of the leads impossible. Highly reliable bonding cannot be achieved. Moreover, since the substrate and IC component may be expanded when bonding with heat, when the substrate is cooled after bonding the leads of the IC component may be cut or disconnected at the opposite side of the surface where the IC component is soldered and bonded with the liquid crystal. Furthermore, a heating tool in which a pulse current flows is easily deformed by heat. When all the leads extending from one side of the IC component are to be wholly pressed by the heating tool, it is difficult to ensure the parallelism of the heating tool to the circuit substrate, due to the recent trend that IC components are formed large in size. Adverse influences occur, such as warping of the substrate or an irregularity of the thickness of the bonding metallic layer, resulting in the generation of imperfectly bonded leads.

Next, a conventional bonding method of TAB electronic components will be depicted hereinbelow.

FIG. 10 is an explanatory diagram of the conventional bonding method of TAB electronic components. In FIG. 10, reference numeral 31 is a liquid crystal panel and reference numeral 32 represents a TAB electronic component such as a LSI to be driving mounted according to the TAB method. An anisotropic conductive sheet 33 is attached to a connecting terminal part of the liquid crystal panel 31. More specifically, the anisotropic conductive sheet 33 mounted at the connecting terminal part of the liquid crystal panel 31 is temporarily fixed with some pressure and heat. Then, after bonding leads of the TAB electronic component 32 are registered with the connecting terminals of the liquid crystal panel 31, the electronic component 32 is actually heated and pressured to be perfectly bonded with the liquid crystal panel 31.

In the above-described method, however, specific equipment is required to register and temporarily fix the long anisotropic conductive sheet to the liquid crystal panel. It is also necessary to feed and mount the TAB electronic component immediately after the anisotropic conductive sheet is temporarily fixed to the liquid crystal panel so as to prevent deterioration of the anisotropic conductive sheet and the adhesion of dust to the anisotropic conductive sheet.

SUMMARY OF THE INVENTION

The object of the present invention is therefore to provide a bonding method designed to bond external leads of an IC component with electrodes of a circuit substrate with high reliability even in the presence of a warp or deflection of the IC component or the circuit substrate or an irregularity in the thickness of a bonding metallic layer, without any accompanying adhesion of the flux to the bonding metallic layer and the external lead of the IC component.

A further object of the present invention is to provide a bonding method for a TAB electronic component which enables mounting of the TAB electronic component with the use of an anisotropic conductive sheet without attaching the anisotropic conductive sheet to a terminal part of a large-size circuit substrate.

In accomplishing these and other objects, according to a first aspect of the present invention, there is provided a method of bonding external leads which comprises the steps of: registering the external leads of an IC component with electrodes of a circuit substrate; setting an external lead retaining surface of a bonding tool on a flat outer tab obtained by coating a plurality of outer end parts of the external leads of the registered IC component with a synthetic resin, and bringing the external leads in touch with the corresponding electrodes; irradiating one of the external leads registered on one of the electrodes with a laser beam to thereby bond the electrode and the external lead; and jetting a cooling gas to a bonding part of the external lead to cool a bonding part of the external lead and the electrode.

According to a second aspect of the present invention, there is provided a method of bonding external leads which comprises the steps of: registering the external leads of an IC component with electrodes of a circuit substrate; setting an external lead retaining surface of a bonding tool on a flat outer tab obtained by coating a plurality of outer end parts of the external leads of the registered IC component with a synthetic resin, and bringing the external leads in touch with the corresponding electrodes; and irradiating a bonding part of one of the external leads with a laser beam while pressing the one of the external leads registered on one of the corresponding electrodes against the electrode to thereby to bond a bonding part of the electrode and the external lead.

According to a third aspect of the present invention, there is provided a bonding tool for bonding external leads of an IC component to electrodes of a circuit substrate, the bonding tool comprising a wall having an external lead retaining surface to be set on a flat outer tab obtained by coating a plurality of outer end parts of the external leads of the IC component with a synthetic resin and pressing one of the external leads to bring the one of the external leads into touch with a corresponding one of the electrodes, a laser beam passage through which a laser beam is irradiated on a bonding part of the external lead, and a gas passage through which a cooling gas is jetted to the bonding part of the external lead to cool a bonding part of the external lead and the electrode.

According to a fourth aspect of the present invention, there is provided a bonding tool for bonding external leads of an IC component to electrodes of a circuit substrate, the bonding tool comprising a wall having an external lead retaining surface to be set on a flat outer tab obtained by coating a plurality of outer end parts of the external leads of the IC component with a synthetic resin and pressing one of the external leads to bring the external lead in touch with a corresponding one of the electrodes, a laser passage through which a laser beam is irradiated or a bonding part of the external lead, and a pressing member for pressing the one of the external leads registered with the one of the electrodes against the electrode when the laser beam is irradiated.

According to a fifth aspect of the present invention, there is provided a bonding method of a TAB electronic component whereby the TAB electronic component having an anisotropic conductive sheet attached to bonding lead parts thereof is suctioned by a suction nozzle and transferred to a connecting terminal part of a circuit substrate, where the bonding lead part is heated and pressured, so that the bonding lead part and the connecting terminal part are connected via the anisotropic conductive sheet.

BRIEF DESCRIPTION OF THE DRAWINGS

These and other objects and features of present invention will become clear from the following description taken in conjunction with preferred embodiments thereof and with reference to the accompanying drawings, in which:

FIGS. 8, 9A, and 9B are a perspective view of the whole of a component mounting apparatus, an enlarged view showing the suction nozzle in the apparatus, and a perspective view showing component cassettes in the apparatus.

DETAILED DESCRIPTION OF THE PREFERRED EMBODIMENTS

Figure 1:
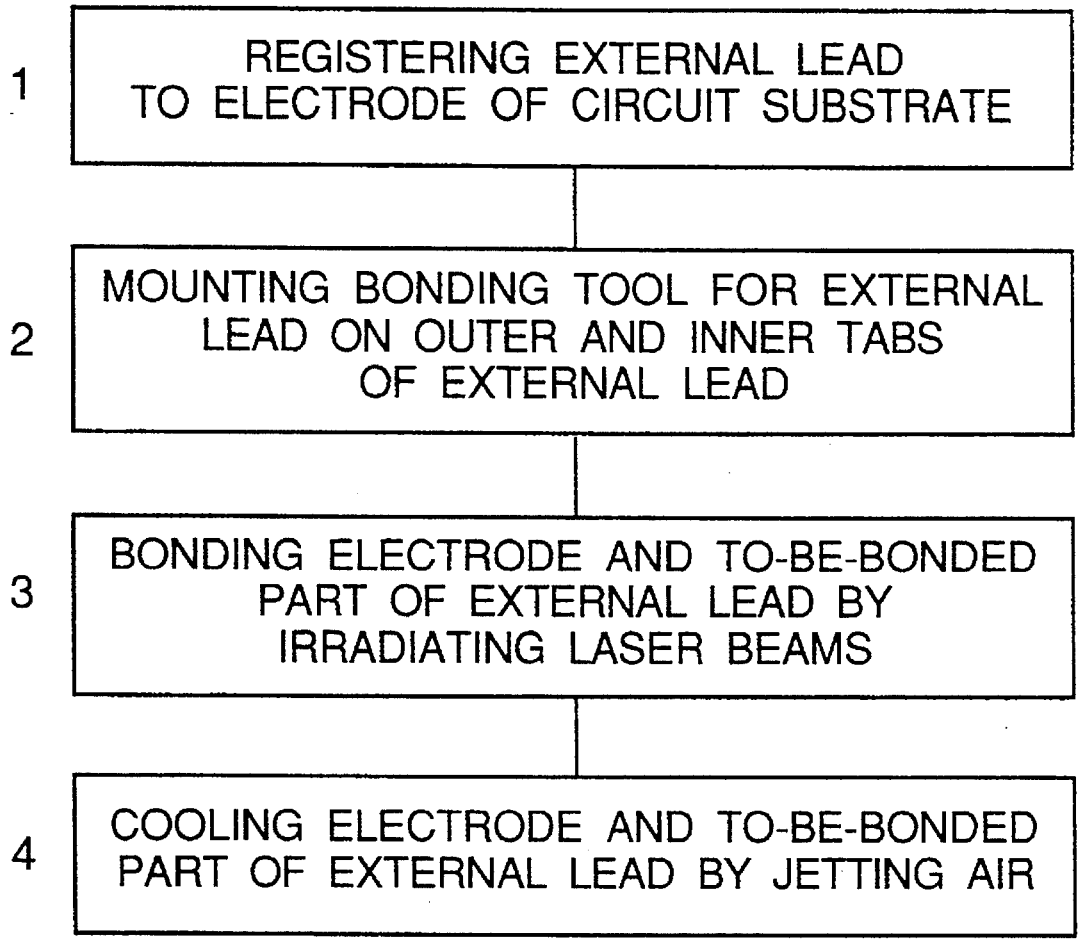
FIG. 1 is a flow chart of a bonding method of an external lead according to a first embodiment of the present invention.

Before the description of the present invention proceeds, it is to be noted that like parts are designated by like reference numerals throughout the accompanying drawings.

The following description is related to a method and an apparatus for bonding an external lead of an IC component according to a first embodiment of the present invention.

Referring to a flow chart of FIG. 1, the bonding method according to the first embodiment of the present invention includes four processing steps, namely, (step #1) to register an external lead to an electrode of a circuit substrate; (step #2) to mount a bonding tool for the external lead on outer and inner tabs of an external lead hole; (step #3) to bond the electrode and a to-be-bonded part of the external lead with irradiating laser beams; and (step #4) to cool the electrode and the to-be-bonded part of the external lead by jetting air.

The apparatus for embodying the above bonding method will be described with reference to FIGS. 2 and 3.

Figure 2:
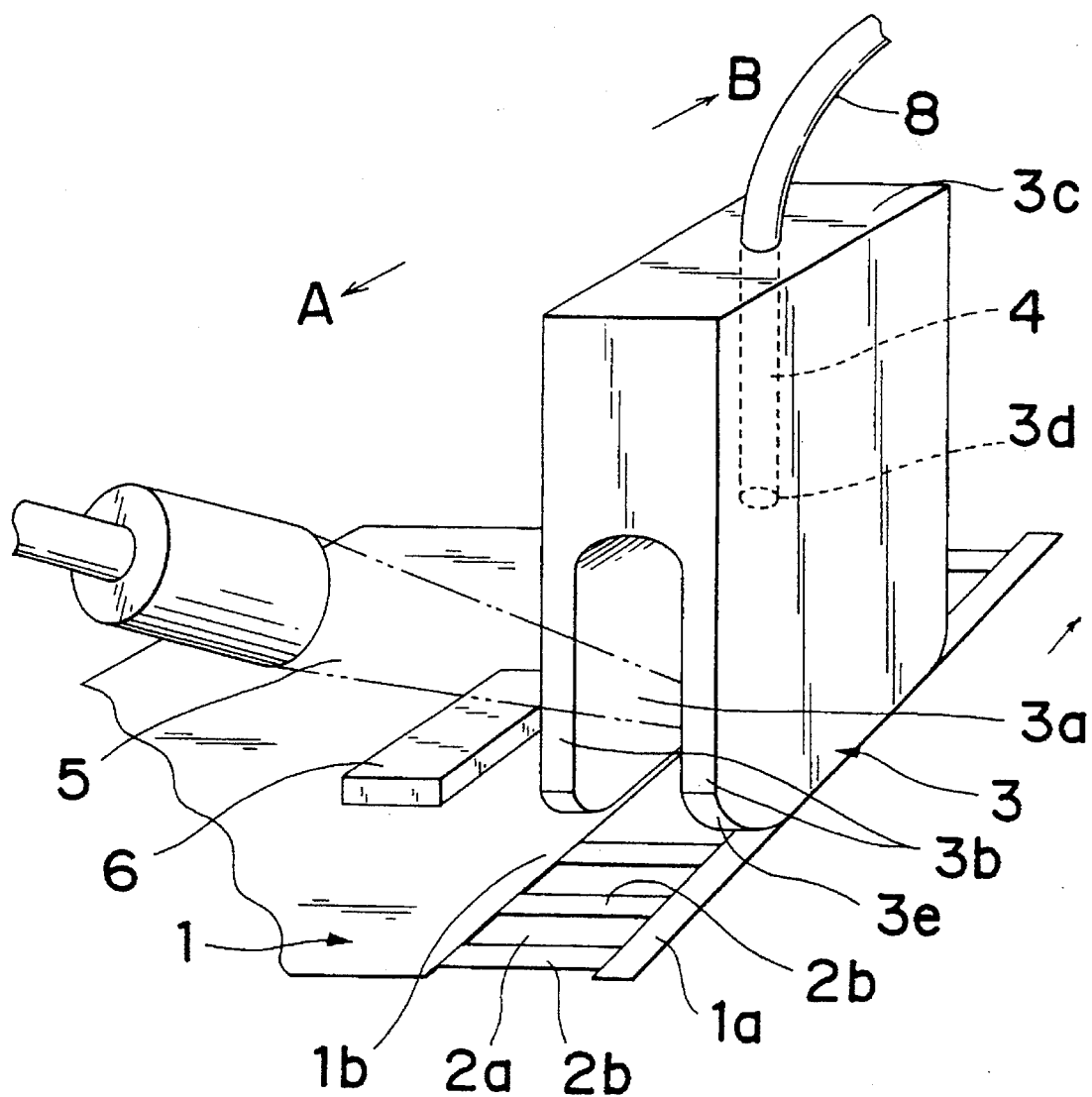
FIG. 2 is a perspective view showing the constitution of a bonding tool used in the first embodiment of the present invention.
Figure 3:
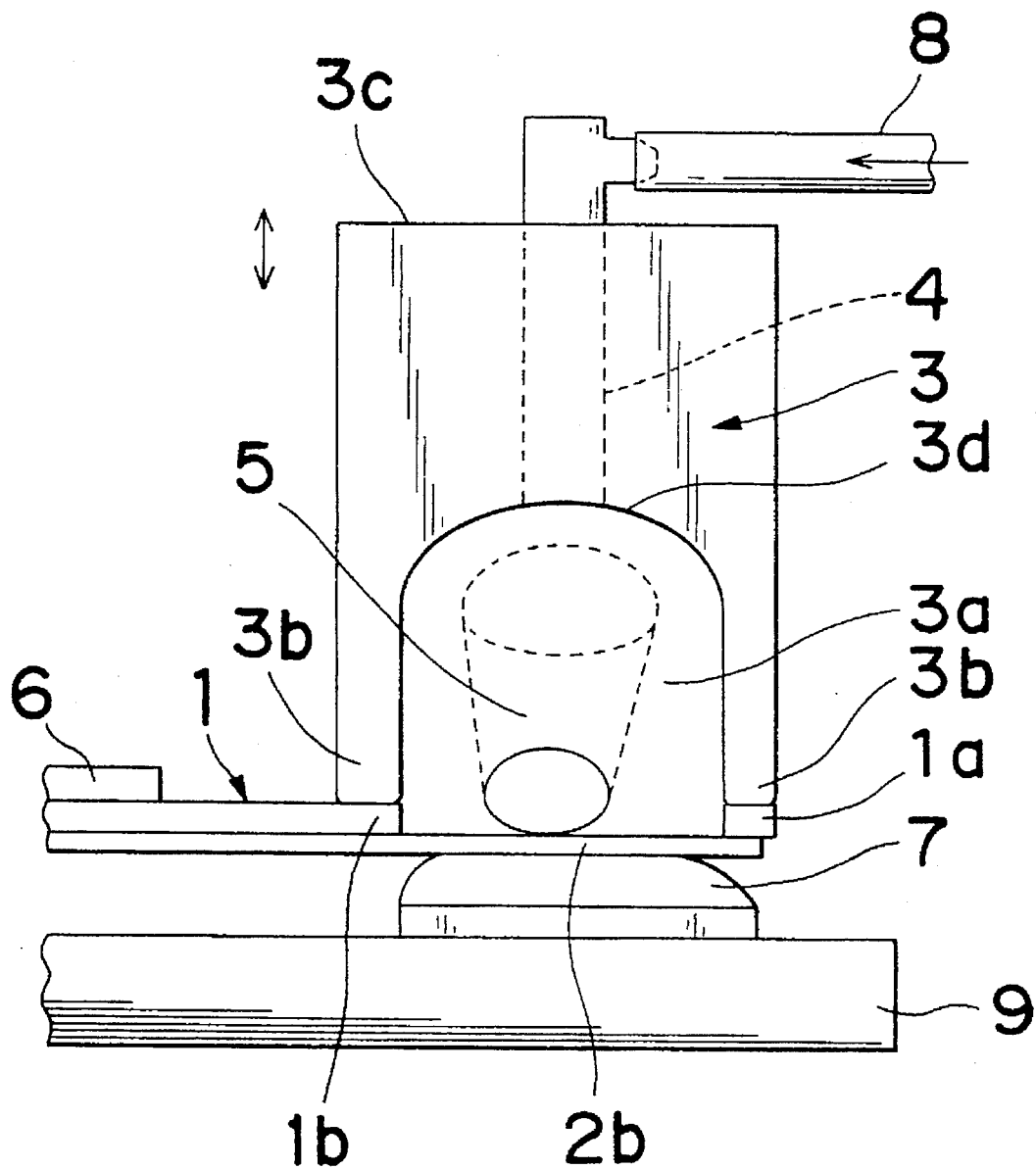
FIG. 3 is a side view of the bonding tool of FIG. 2 placed on outside and inside tabs of an external lead hole.

In FIGS. 2 and 3, a flat tab 1 made of polyimide resin or the like is coated over an external lead 2 of an IC component 6 to be bonded with an electrode 7 of a circuit substrate 9. An external lead 2b at a bonding part of the external lead, where the resin coat is removed, is separated every predetermined pitch via an external lead hole 2a. The resin coat remains at an end part 1a (tab at the outer side of the external lead hole 2a).

A bonding tool 3 (referred to only as a tool hereinafter) for the external lead comprises a bonding tool body having an opening part 3a in the lower part thereof as a U-sectional entrance for laser beams, a pair of walls or foot parts 3b opposed to both sides of the opening part 3a, and an air hole 4 opened at a top surface 3c to an upper part 3d of the opening part 3a so as to jet the cooling air to the bonding part. The outer tab 1a and an inner tab 1b of the resin-covered tab 1, respectively at the outer side and the inner side of the external lead hole 2a, are held by the foot parts 3b so that the external lead 2b is brought in touch with the electrode 7 of the circuit substrate 9. The opening part 3a is slightly wider than the external lead hole 2a between the leads 2b. Each foot part 3b for holding the outer or inner tab 1a or, 1b is made slightly wider than the outer tab 1a of the external lead hole 2a, and is longer than the pitch of the external leads 2b, and preferably long enough to cover and press on at least three external leads. Moreover, each foot part 3b has at its lower end an arc part 3e to conform with the warp of the tab 1. Reference numeral 5 is a laser for emitting laser beams onto the external lead 2b in touch with the registered electrode 7, and reference numeral 8 is a tube through which cooling air is supplied to the air hole 4.

Now a mechanism for pressing the outer tab 1a and the inner tab 1b of the tab 1 by means of the tool 3 will be described in detail.

Figure 4:
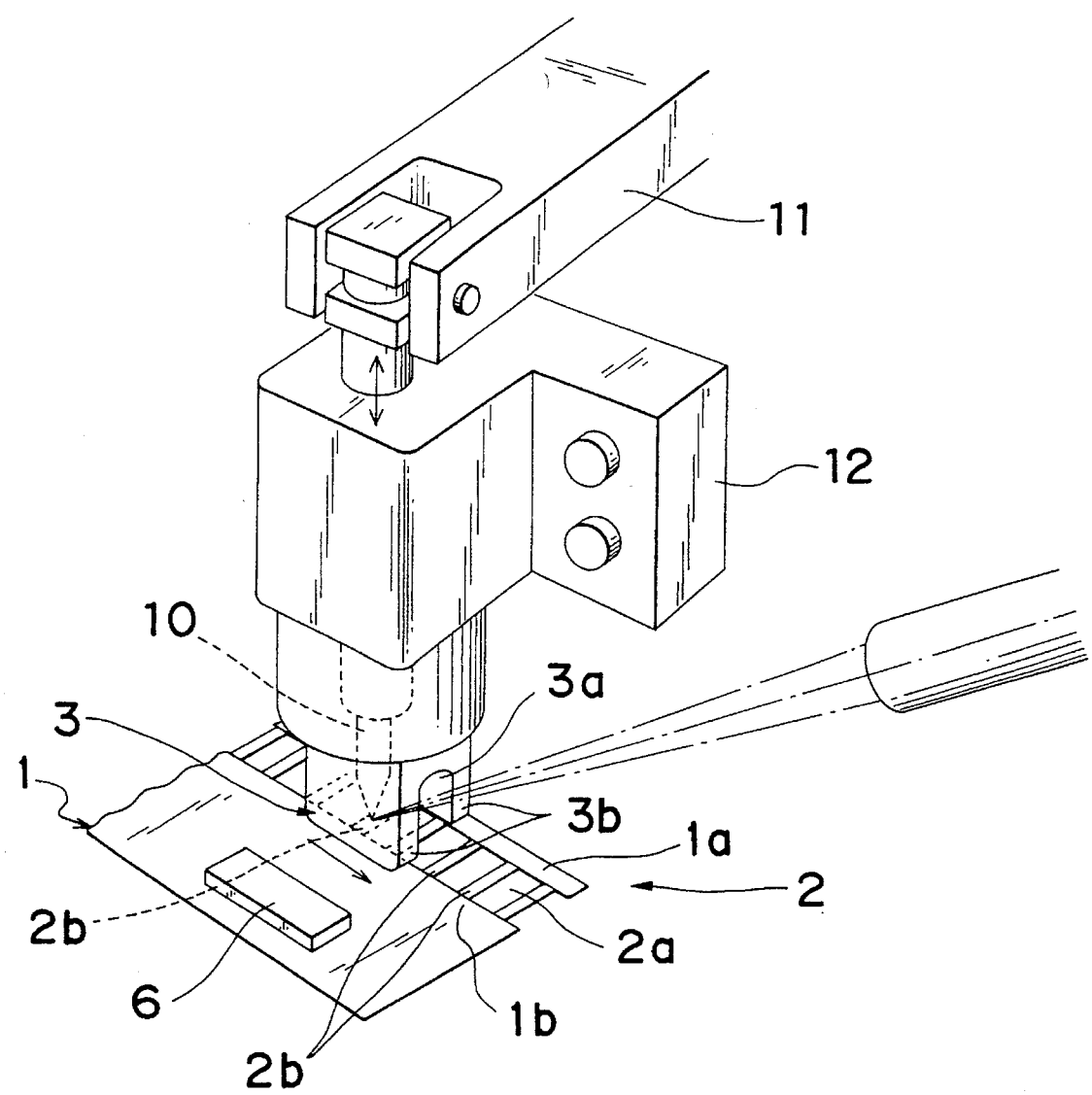
FIG. 4 is an illustration of a lead pressing member in the first embodiment of the present invention.

As shown in FIG. 4, the tool 3 is supported by a holder 12. While the tool 3 is urged by the holder 12 in a manner to press the outer tab 1a and the inner tab 1b via the foot parts 3b, the tool 3 is moved in the arrow direction. A pressing member 10 is movable up and down at this time between the foot parts 3b in the tool 3. As the pressing member 10 presses one of the plural external leads 2b held between the foot parts 3b to the electrode 7, the laser 5 emits laser beams thereby to bond the external lead 2b with the electrode 7. The laser beams are focused on a lower end of the pressing member 10.

The operation of the above-described tool 3 will be depicted below.

In FIGS. 1 through 3, after the tool 3 is moved above the external lead 2b registered with the electrode 7 of the circuit substrate 9, the tool 3 is lowered and then set on the outer and inner tabs 1a and 1b surrounding the external lead hole 2a. When the external lead 2b comes in touch with the electrode 7, the laser beams are irradiated from the laser 5 to bond the external lead 2b and the electrode 7, i.e. the bonding part. A predetermined time later, cooling air supplied from the air hole 4 through the tube 8 is jetted to cool the bonding part. The air hole 4 is located in a direction of an arrow B from the irradiating position of the laser 5. Subsequently, the tool 3 is moved in parallel in a direction of an arrow A at a constant speed and at a constant height, thereby bonding the electrode 7 with the external lead 2b at every point. When all of the external leads 2 of the IC component 6 are bonded, the tool 3 is raised and moved to a tab of a next IC component 6. The external leads 2b of the IC component 6 can be bonded to the electrodes 7 of the circuit substrate 9 by repeating the aforementioned procedure.

As described hereinabove, the bonding method of the first embodiment includes the registering process to register the external lead 2b to the electrode 7 of the circuit substrate 9, the mounting process to mount the tool 3 above the outer and inner tabs 1a, 1b of the external lead hole 2a, the bonding process to bond the electrode 7 with the external lead 2b by laser beams, and the cooling process to cool the bonding part between the electrode 7 and the external lead 2b by jetting the cooling air. Accordingly, the electrode 7 can be bonded to the external lead 2b with the tool 3 not being brought in direct touch with the bonding part of the external lead 2b. Solder or flux adhering to the tool 3, making the bonding instable, can hence be prevented.

Owing to the above-described constitution, while the inner and outer tabs 1a and 1b of the external lead 2b are held by the tool 3, the laser beams are irradiated onto the bonding part between the electrode 7 of the circuit substrate 9 and the external lead 2b registered to the electrode 7 and in touch with the electrode 7. Accordingly, the bonding part of the electrode 7 and the external lead 2b can be bonded without pressing the tool 3 directly in touch with the external lead 2b.

Moreover, since the bonding part is cooled by the cooling air jetted out from the air hole, the time when the molten solder and evaporated flux stay in the periphery of the tool 3 is shortened, therefore preventing the adhesion of solder and flux to the tool 3, which would result in instable bonding.

It is important in the above first embodiment that the foot parts (tab retainers) 3b of the tool 3 are constituted by walls, whereby the laser beams are prevented from being irradiated to an unnecessary portion. However, the inner foot part 3b may be omitted so long as the laser beams can be controlled correctly.

A second embodiment of the present invention will now be described with reference to the accompanying drawings.

Figure 9A:
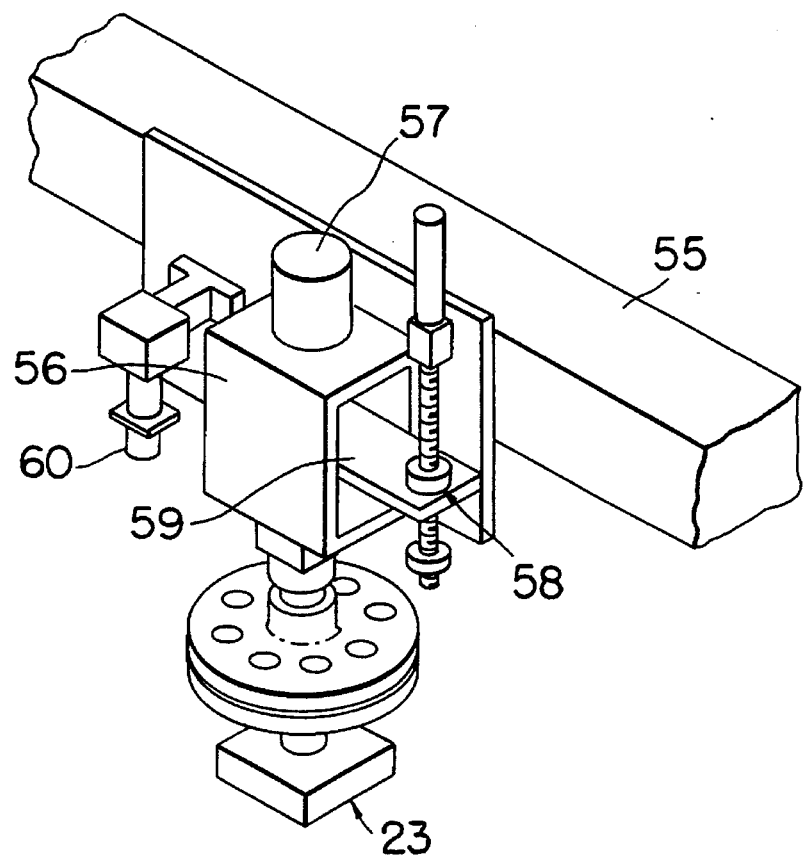
Figure 9B:
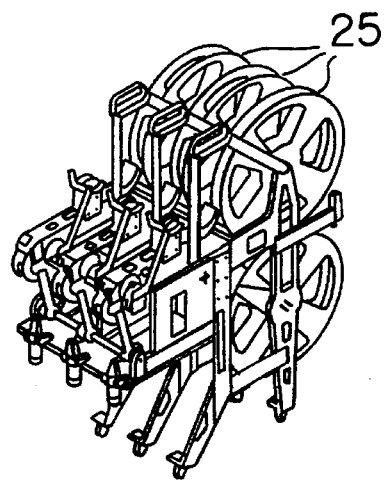

Before the description of the second embodiment, a mounting apparatus for mounting TAB (Tape Automated Bonding) electronic components, which includes an apparatus to be used in a bonding method of TAB electronic components according to the second embodiment, will be depicted with reference to FIGS. 8, 9A, and 9B.

Figure 7:
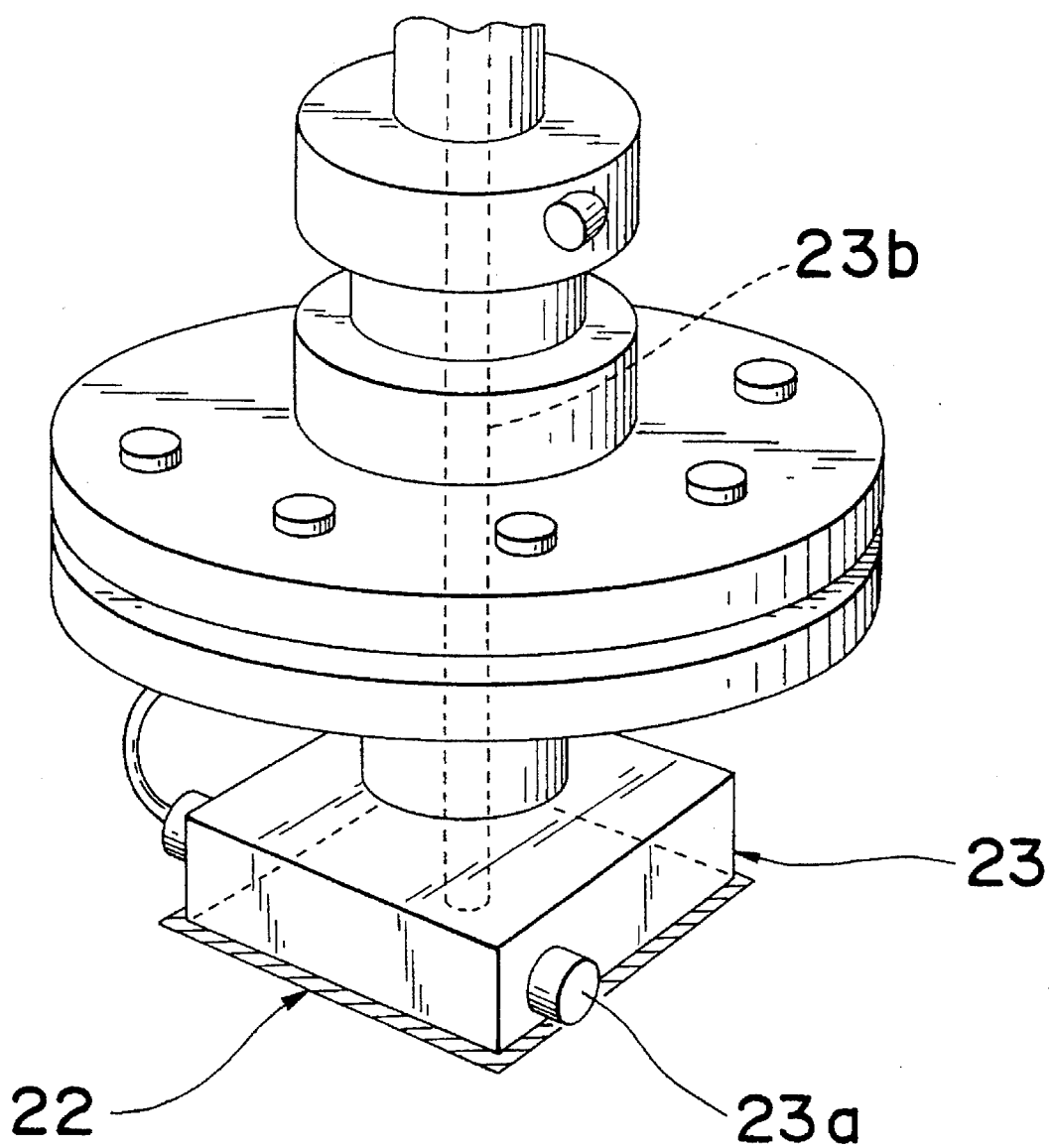
FIG. 7 is an enlarged perspective view of a suction nozzle in the second embodiment of the present invention.

In FIGS. 8, 9A, and 9B, an arm 51 for holding a liquid crystal display 52 is moved along a longitudinal direction of the apparatus by a belt 50. In FIG. 8, four TAB electronic components 22 are located to be attached to the liquid crystal display 52 by a suction nozzle 23. The suction nozzle 23 is shown in FIGS. 7 and 9A. The nozzle 23 can be moved along XY-directions by XY guides 54 and 55 for linear guiding. The nozzle 23 is held with the Y guide 55 via a bracket 56. A motor 57 is arranged on the bracket 56 to upwardly and downwardly move the nozzle 23. Reference numeral 59 denotes a guide plate for guiding the upward and downward movement of the nozzle 23 by a ball-screw guide member 58. An upper camera 60 is located at one end of the guide plate 59 for recognizing the component held by the nozzle 23. In FIG. 8, reference numeral 53 denotes a lower camera for recognizing the component held by the nozzle 23, and 60 shows a region for arranging a plurality of component cassettes 25 shown in FIG. 9B. A component supplied from the component cassettes 25 is suctioned by the nozzle 23 when the nozzle is moved above part of the region 60.

Figure 5:
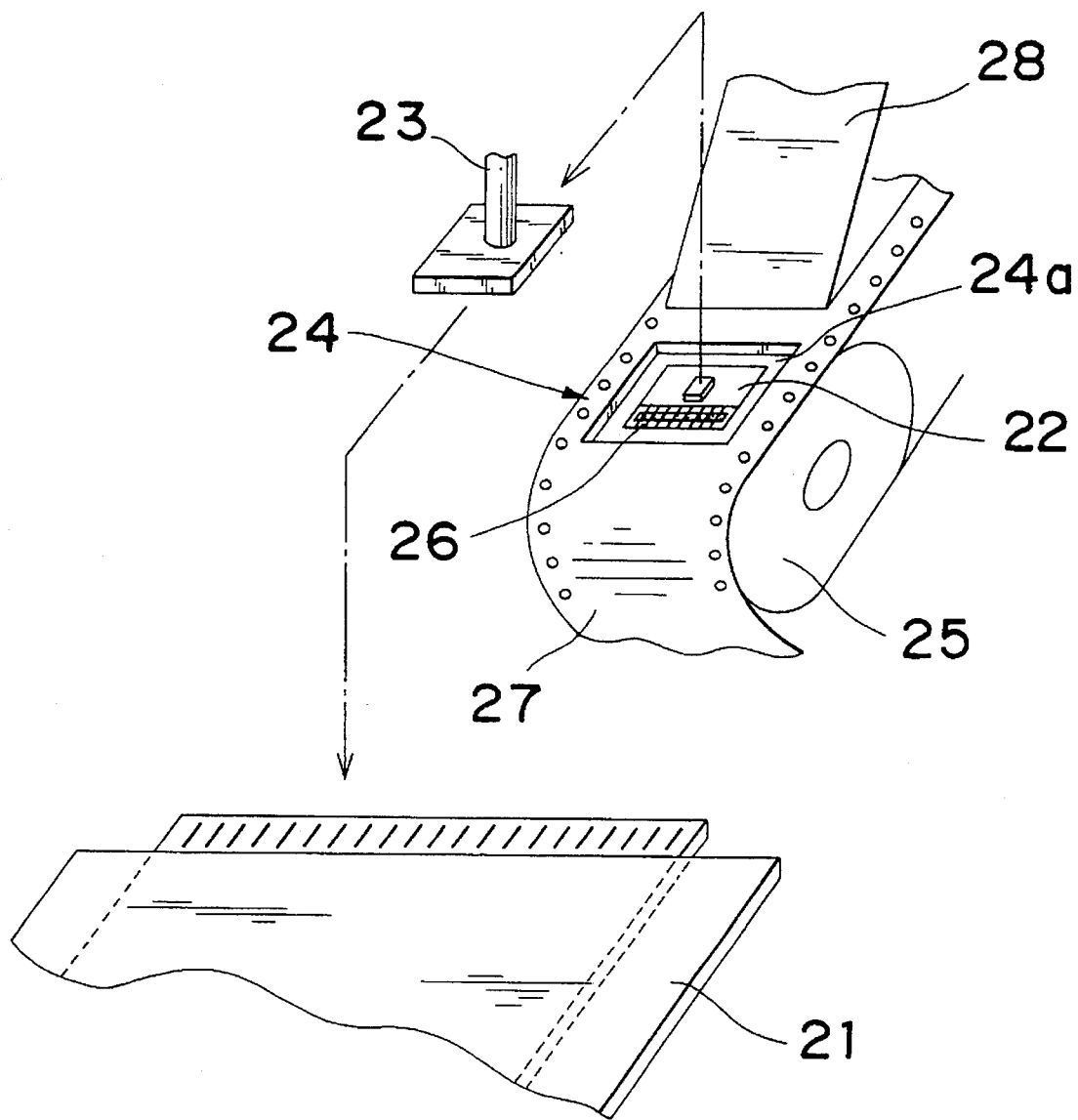
FIG. 5 is an explanatory view of a bonding method for TAB electronic components according to a second embodiment of the present invention.

FIG. 5 is a diagram explanatory of the bonding method for TAB electronic components according to the second embodiment. In FIG. 5, reference numbers indicate, respectively: 21 a liquid crystal panel; 22 a TAB electronic component; 23 the suctioning nozzle for sucking and transferring the TAB electronic component 22; 24 an embossed tape for accommodating and covering the TAB electronic component 22 with a tape in a recessed embossed part 24a; 25 a component cassette for accommodating the embossed tape 24; and 26 an anisotropic conductive sheet attached to bonding leads of the TAB electronic component 22.

Figure 6:
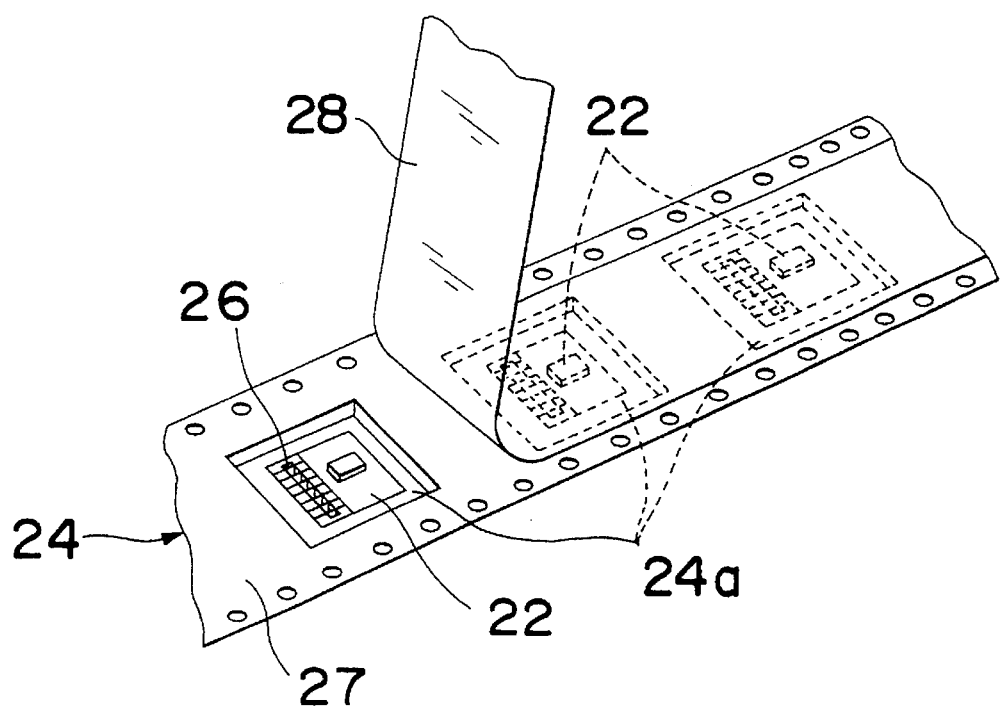
FIG. 6 is an explanatory view of a taping method for TAB electronic components in the second embodiment of the present invention.
Figure 10:
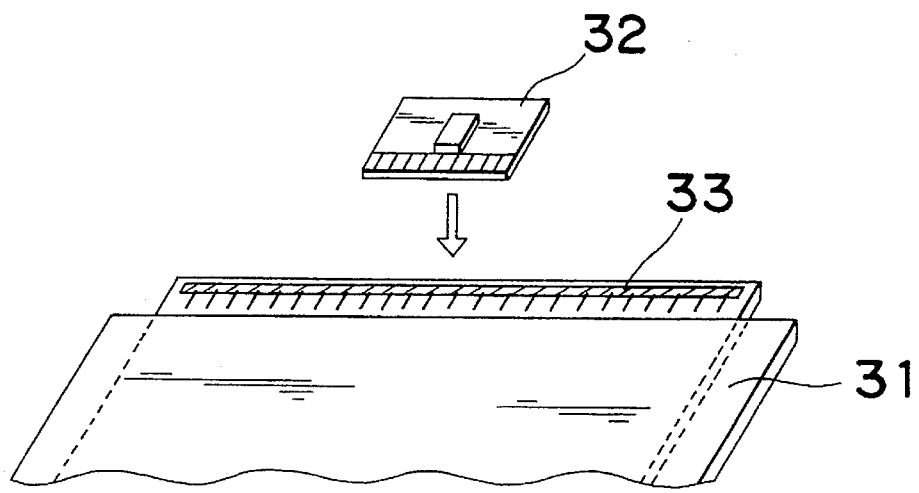
FIG. 10 is an illustration of a conventional bonding method of TAB electronic components.

FIG. 6 shows an explanatory view of a taping method in the second embodiment of the present invention. The embossed tape 24 is formed of a carrier tape 27 with the recessed part 24a where the TAB electronic component 22 is accommodated, and a top tape 28 for sealing the TAB electronic component 22 in the recessed part 24a of the carrier tape 27.

The operation when the TAB electronic component is bonded in accordance with the second embodiment will be described below. As indicated in FIG. 6, the TAB electronic component 22 having the anisotropic conductive sheet 26 attached to the bonding lead thereof is accommodated in the recessed part 24a of the carrier tape 27 and temporarily fixed to the bottom of the recessed part 24a with the anisotropic conductive sheet 26. Since the electronic component 22 is temporarily secured by the anisotropic conductive sheet 26 as above, the lead terminal of the electronic component 22 is prevented from being deformed as a result of the vibration during the transfer or the positional displacement, for example, inclination or the like of the component. Moreover, since the TAB electronic component 22 is sealed by the top tape 28 which can block the air, moisture, the quality of the TAB electronic component 22 can be well preserved.

After the TAB electronic components 22 are covered with the tapes 24 and 28, the embossed tape 24 with the components 22 is set in the component cassette 25 of FIG. 5. While the top tape 28 is being peeled from the embossed tape 24, the electronic components 22 are suctioned and transferred one by one by the suction nozzle 23. After the bonding lead of the TAB electronic component 22 is registered with the connecting terminal of the liquid crystal panel 21, the anisotropic conductive sheet 26 is pressured and heated, thereby completing bonding. At this time, the anisotropic conductive sheet 26 is heated by a heater 23a built in the suction nozzle 23 as shown in FIG. 7. Reference numeral 23b in FIG. 7 is a suction passage.

In the second embodiment, the embossed tape 24 is formed in the structure sealed by the top tape 28. However, the top tape 28 is not always necessary depending on the conditions of use.

Although the second embodiment is discussed in relation to bonding of the connecting terminal of the liquid crystal panel 21 with the lead of the TAB electronic component 22, the same effect is obtained even if the liquid crystal panel 21 is replaced with some other kind of circuit substrate.

As is clear from the foregoing description of the present invention, a procedure for attaching a long anisotropic conductive sheet at the side of the circuit substrate is unnecessary and equipment therefor can be dispensed with. Moreover, since the TAB electronic component is sealed in the embossed tape with the use of the anisotropic conductive sheet, outside influences on the anisotropic conductive sheet can be reduced, and the TAB electronic component can be bonded well, irrespective of the preserving circumstances.

If an inert gas, for example, $N_2$ gas is filled in the recessed part 24a of the embossed tape 24 sealed by the top tape 28 in the second embodiment, the life of the anisotropic conductive sheet 26 can be improved by the inert gas.

Although the present invention has been fully described in connection with the preferred embodiments thereof and with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A method of bonding external leads, comprising the steps of:

registering the external leads of an IC component with electrodes of a circuit substrate, the external leads of the IC component having a flat outer tab of synthetic resin coating a plurality of outer end parts of the external leads;

setting an external lead holding surface of a bonding tool on the flat outer tab and bringing the external leads into contact with the corresponding electrodes;

irradiating a bonding part of one of the external leads registered with one of the corresponding electrodes with a laser beam while pressing the external lead against the electrode so as to bond the bonding part of the external lead with a bonding part of the electrode; and jetting a cooling gas to the bonding part of the external lead to cool the bonding parts of the external lead and the electrode.

2. The bonding method of claim 1, wherein in said step of setting, the external lead holding surface presses on at least three of the external leads against the electrodes.

3. The bonding method of claim 1, wherein:

said step of setting further comprises setting the bonding tool on a flat inner tab of synthetic resin coating the external leads of the IC component at inner portions thereof, the inner and outer tabs having the external leads exposed therebetween; and said step of irradiating further comprises irradiating the bonding part between respective portions of the bonding tool set on the inner and outer tabs.

4. The bonding method of claim 3, and further comprising the steps of:

moving the bonding tool along the flat outer tab; and repeating said step of irradiating for a bonding part of a next one of the external leads registered with one of the corresponding electrodes.

5. The bonding method of claim 1, and further comprising the steps of:

moving the bonding tool along the flat outer tab; and repeating said step of irradiating for a bonding part of a next one of the external leads registered with one of the corresponding electrodes.

6. A method of bonding a TAB electronic component, comprising the steps of:

accommodating a TAB electronic component in a recessed part of a carrier tape by attaching an anisotropic conductive sheet to bonding lead parts of the TAB electronic component and positioning the TAB electronic component on a bottom surface of the recessed part of the carrier tape;

suctioning the TAB electronic component from the bottom surface of the recessed part of the carrier tape with a suction nozzle;

transferring the TAB electronic component to a connecting terminal part of a circuit substrate; and heating and pressuring the bonding lead part of the TAB electronic component so that the bonding lead part and the connecting terminal part are connected by the anisotropic conductive sheet.

7. The bonding method of claim 6, wherein said step of accommodating further comprises sealing the recessed part of the carrier tape by covering the recessed part with a top tape after the anisotropic conductive sheet is attached to the bonding lead parts of the TAB electronic component.

8. The bonding method of claim 6, wherein said step of accommodating further comprises filling an inert gas in a sealed space of the recessed part.

9. A bonding tool for bonding external leads of an IC component to electrodes of a circuit substrate, said bonding tool comprising:

a bonding tool body that comprises a wall member having an external lead holding surface on a lower side thereof adapted to be set on a flat outer tab on outer ends of external leads of an IC component for pressing one of the external leads against a corresponding electrode of a circuit substrate, a laser beam passage defined by said bonding tool body adjacent to said wall member and adapted to receive a laser beam therethrough for irradiating a bonding part of an external lead, a gas passage extending through said bonding tool body and intersecting said laser beam passage, said gas passage being adapted to receive a cooling gas therethrough and to jet the cooling gas therefrom to a bonding part of an external lead and electrode, and a pressing member movable relative to said bonding tool body adjacent to said wall member for pressing an external lead against an electrode when the laser beam is irradiated.

10. The bonding tool of claim 9, and further comprising a laser emitting device for emitting a laser beam through said laser beam passage.

11. The bonding tool of claim 9, wherein said external lead holding surface has a predetermined length sufficient to hold at least three external leads against corresponding electrodes.

12. The bonding tool of claim 9, wherein said wall member of said bonding tool body is an outside wall member and said bonding tool body further comprises an inside wall member, wherein said inside wall member is disposed opposite to said outside wall member and adapted to press an inner tab of an external lead against an electrode, and said laser beam passage is defined between said outside wall member and said inside wall member.

13. The bonding tool of claim 12, wherein said external lead holding surface has a predetermined length sufficient to hold at least three external leads against corresponding electrodes.

14. A bonding tool for bonding external leads of an IC component to electrodes of a circuit substrate, said bonding tool comprising:

a bonding tool body that comprises a wall member having an external lead holding surface adapted to be set on a flat outer tab on outer ends of external leads of an IC component for pressing one of the external leads against a corresponding electrode of a circuit substrate, a laser beam passage defined by said bonding tool body adjacent to said wall member and adapted to receive a laser beam therethrough for irradiating a bonding part of an external lead, a gas means for jetting a cooling gas to a bonding part of an external lead and electrode through said laser beam passage and adjacent to said wall member, and a pressing means for pressing an external lead against an electrode in said laser beam passage and adjacent to said wall member when the laser beam is irradiated.

* * * * *